US006541131B1

(12) United States Patent
Ristau (10) Patent No.: US 6,541,131 B1
(45) Date of Patent: Apr. 1, 2003

(54) PERPENDICULAR RECORDING MEDIA WITH ENHANCED COERCIVITY (75) Inventor: Roger A. Ristau, Livermore, CA (US)

(73) Assignee: Seagate Technology LLC, Scotts Valley, CA (US)

(*) Notice: Subject to any disclaimer, the term of this patent is extended or adjusted under 35 U.S.C. 154(b) by 0 days.

(21) Appl. No.: 09/845,167

(22) Filed: May 1, 2001

Related U.S. Application Data (60) Provisional application No. 60/207,464, filed on May 25, 2000.

(51) Int. Cl.[7] .............................. G11B 5/66; G11B 5/70; B05D 5/12; C23C 14/34
(52) U.S. Cl. ................. 428/694 T; 428/65.3; 428/65.5; 428/694 TM; 428/694 TP; 428/900; 427/130; 427/132; 427/383.1; 204/192.1; 204/192.2
(58) Field of Search .................... 428/694 TS, 694 TM, 428/65.3, 65.5, 694 T, 694 TP, 900; 204/192.2, 192.15, 192.1; 427/131, 130, 132, 559, 383.1

(56) References Cited

U.S. PATENT DOCUMENTS

| 5,363,794 A | 11/1994 | Lairson et al. ................. 117/7 |
| 5,603,766 A | 2/1997 | Visokay et al. ............. 117/105 |
| 5,792,564 A | 8/1998 | Hikosaka et al. ........... 428/610 |
| 5,815,342 A | * 9/1998 | Akiyama et al. ........ 360/97.01 |
| 5,897,931 A | 4/1999 | Ahlert et al. ............... 428/65.5 |
| 5,942,342 A | 8/1999 | Hikosaka et al. ....... 428/694 R |
| 5,989,728 A | * 11/1999 | Coeffey et al. ............. 428/611 |
| 5,991,126 A | 11/1999 | Hayashi et al. ............. 360/125 |
| 6,013,161 A | 1/2000 | Chen et al. ............. 204/192.2 |
| 6,086,974 A | 7/2000 | Thiele et al. .............. 428/65.3 |
| 6,395,413 B1 | * 5/2002 | Ando ..................... 428/694 T |
| 2002/0012816 A1 | * 1/2002 | Shimizu et al. ...... 428/694 TM |

FOREIGN PATENT DOCUMENTS

| JP | 1-214002 | * 8/1989 |
| JP | 2074012 | 3/1990 |
| JP | 5062834 | 3/1993 |
| JP | 5234056 | 9/1993 |
| JP | 5234058 | 9/1993 |
| JP | 5325165 | 12/1993 |

OTHER PUBLICATIONS

V. Parasote et al., "Anisotropy and coercivity in $Co_{50\pm x}Pt_{50\mp x}$ alloy films", Journal of Magnetism and Magnetic Materials 198–199 (1999) p. 375–377.

* cited by examiner

Primary Examiner—Holly Rickman
(74) Attorney, Agent, or Firm—Morrison & Foerster LLP (57) ABSTRACT A perpendicular magnetic recording medium having a substrate and an annealed magnetic layer comprising boron on the substrate, the magnetic layer being a single film and having an $L1_0$ structure, and a process for manufacturing the perpendicular magnetic recording medium are disclosed.

13 Claims, 7 Drawing Sheets

← Protective overcoat 23

← Magnetic layer 22

← Underlayer 21

← Substrate 20

← Underlayer 21'

← Magnetic layer 22'

← Protective overcoat 23'

PERPENDICULAR RECORDING MEDIA WITH ENHANCED COERCIVITY

RELATED APPLICATIONS

This application claims priority from Provisional Application Ser. No. 60/207,464 filed May 25, 2000, entitled "Perpendicular Recording Media with Enhanced Coercivity," the entire disclosure of which is hereby incorporated herein by reference.

FIELD OF INVENTION

This invention relates to perpendicular recording media, such as thin film magnetic recording disks having perpendicular recording, and to a method of manufacturing the media. The invention has particular applicability to high areal density magnetic recording media exhibiting low noise, and high coercivity.

BACKGROUND

The increasing demands for higher areal recording density impose increasingly greater demands on thin film magnetic recording media in terms of remanent coercivity (Hr), magnetic remanance (Mr), coercivity squareness (S*), medium noise, i.e., signal-to-medium noise ratio (SMNR), and narrow track recording performance. It is extremely difficult to produce a ma retic recording medium satisfying such demanding requirements.

The linear recording density can be increased by increasing the Hr of the magnetic recording medium, and by decreasing the medium noise, as by maintaining very fine magnetically non-coupled grains. Medium noise in thin films is a dominant factor restricting increased recording density of high-density magnetic hard disk drives, and is attributed primarily to inhomogeneous grain size and intergranular exchange coupling. Accordingly, in order to increase linear density, medium noise must be minimized by suitable microstructure control.

According to the domain theory, a magnetic material is composed of a number of submicroscopic regions called domains. Each domain contains parallel atomic moments and is always magnetized to saturation, but the directions of magnetization of different domains may be oriented randomly in any number of several directions, called the directions of easy magnetization, which depend on the geometry of the crystal. The resultant effect of all these various directions of magnetization may be zero as is the case with an unmagnetized specimen. When a magnetic filed is applied, the domains most nearly parallel to the direction of the applied field grow in size at the expense of the others. This is called boundary displacement of the domains of the domain growth. A further increase in magnetic field causes more domains of the domain growth. a further increase in magnetic field caused more domains to rotate and align parallel to the applied field. When the material reaches the point of saturation magnetization, no further domain growth would take place on increasing the strength of the magnetization, no further domain growth would take place on increasing the strength of the magnetic field.

The ease of magnetization or demagnetization of a magnetic material depends on the crystal structure, grain orientation, the state of strain, and the direction and strength of the magnetic field. The magnetization is most easily obtained along the easy axis of magnetization but most difficult along the hard axis of magnetization. A magnetic material is said to possess a uniaxial anisotropy when the east axis is oriented along a single crystallographic direction, and to possess multiaxial anisotropy when the easy axis aligns with multiple crystallographic directions.

"Anisotropy energy" is the difference in energy of magnetization for these two extreme directions, namely, the easy axis of magnetization and the hard axis of magnetization. For example, a single crystal of iron, which is made up of a cubic array of iron atoms, tends to magnetize in the directions of the cube edges along which lie the easy axes of magnetization. A single crystal of iron requires about $1.4 \times 10^5$ ergs/cm$^3$ (at room temperature) to move magnetization into the hard axis of magnetization, which is along a cubic body diagonal.

The anisotropy energy $U_a$ could be expressed in an ascending power series of the direction cosines between the magnetization and the crystal axes. For cubic crystals, the lowest-order terms take the form of Equation (1), $$U_a = K_1(\alpha_1^2\alpha_2^2 + \alpha_2^2\alpha_3^2 + \alpha_3^2\alpha_1^2) + K_2(\alpha_1^2\alpha_2^2\alpha_3^2) \quad (1)$$

where $\alpha_1$, $\alpha_2$ and $\alpha_3$ are direction cosines with respect to j the cube, and $K_1$ and $K_2$ are temperature-dependent parameters characteristic of the material, called anisotropy constants.

Anisotropy constants can be determined from (1) analysis of magnetization curves, (2) the torque on single crystals in a large applied field, and (3) single crystal magnetic resonance.

The total energy of a magnetic substance depends upon the state of strain in the magnetic material and the direction of magnetization through three contributions. The first two consist of the crystalline anisotropy energy of the unstrained lattice plus a correction that takes into account the dependence of the anisotropy energy on the state of strain. The third contribution is that of the elastic energy, which is independent of magnetization direction and is a minimum in the unstrained state. The state of strain of the crystal will be that which makes the sum of the three contributions of the energy a minimum. The result is that, when magnetized, the lattice is always distorted from the unstrained state, unless there is no anisotropy.

The requirements for high areal density impose increasingly greater requirements on magnetic recording media in terms of coercivity, remanent squareness, low medium noise and narrow track recording performance. It is extremely difficult to produce a magnetic recording medium satisfying such demanding requirements, particularly a high-density magnetic rigid disk medium for longitudinal and perpendicular recording. The magnetic anisotropy of longitudinal and perpendicular recording media makes the easily magnetized direction of the media located in the film plane and perpendicular to the film plane, respectively. The remanent magnetic moment of the magnetic media after magnetic recording or writing of longitudinal and perpendicular media is located in the film plane and perpendicular to the film plane, respectively.

A substrate material conventionally employed in producing magnetic recording rigid disks comprises an aluminum-magnesium (Al—Mg) alloy. Such Al—Mg alloys are typically electrolessly plated with a layer of NiP at a thickness of about 15 microns to increase the hardness of the substrates, thereby providing a suitable surface for polishing to provide the requisite surface roughness or texture.

Other substrate materials have been employed, such as glass, e.g., an amorphous glass, glass-ceramic material that comprises a mixture of amorphous and crystalline materials, and ceramic materials. Glass-ceramic materials do not normally exhibit a crystalline surface. Glasses and glass-ceramics generally exhibit high resistance to shocks.

Figure 1:
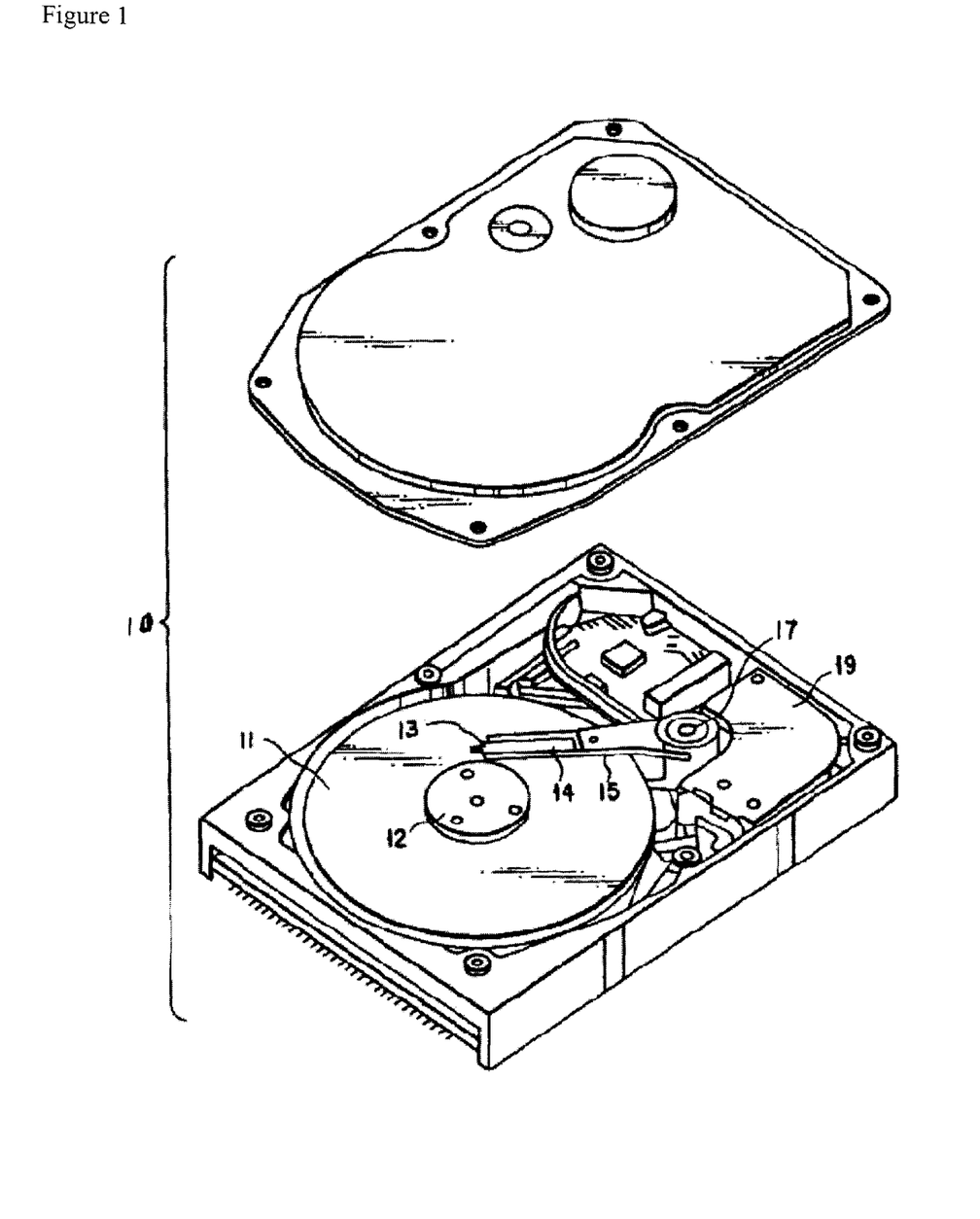
FIG. 1 is a view of a magnetic disk drive.

FIG. 1 shows the schematic arrangement of a magnetic disk drive 10 using a rotary actuator. A disk or medium 11 is mounted on a spindle 12 and rotated at a predetermined speed. The rotary actuator comprises an arm 15 to which is coupled a suspension 14. A magnetic head 13 is mounted at the distal end of the suspension 14. The magnetic head 13 is brought into contact with the recording/reproduction surface of the disk 11. The rotary actuator could have several suspensions and multiple magnetic heads to allow for simultaneous recording and reproduction on and from both surfaces of each medium.

An electromagnetic converting portion (not shown) for recording/reproducing information is mounted on the magnetic head 13. The arm 15 has a bobbin portion for holding a driving coil (not shown). A voice coil motor 19 as a kind of linear motor is provided to the other end of the arm 15. The voice motor 19 has the driving coil wound on the bobbin portion of the arm 15 and a magnetic circuit (not shown). The magnetic circuit comprises a permanent magnet and a counter yoke. The magnetic circuit opposes the driving coil to sandwich it. The arm 15 is swingably supported by ball bearings (not shown) provided at the upper and lower portions of a pivot portion 17. The ball bearings provided around the pivot portion 17 are held by a carriage portion (not shown).

A magnetic head support mechanism is controlled by a positioning servo driving system. The positioning servo driving system comprises a feedback control circuit having a head position detection sensor (not shown), a power supply (not shown), and a controller (not shown). When a signal is supplied from the controller to the respective power supplies based on the detection result of the position of the magnetic head 13, the driving coil of the voice coil motor 19 and the piezoelectric element (not shown) of the head portion are driven.

Figure 2:
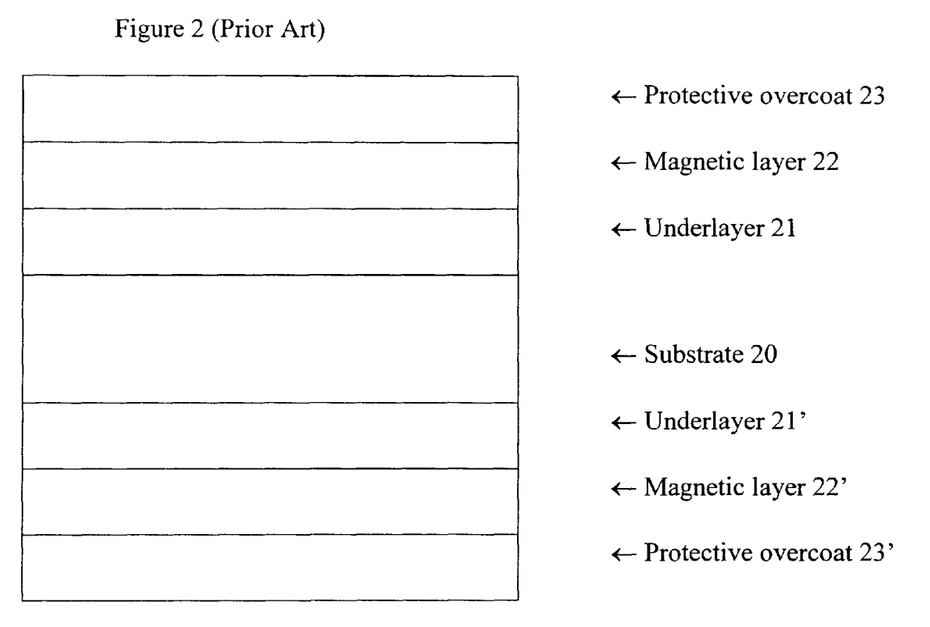
FIG. 2 is a schematic representation of the film structure in accordance with a magnetic recording medium of the prior art.

A cross sectional view of a conventional longitudinal recording disk medium is depicted in FIG. 2. A longitudinal recording medium typically comprises a non-magnetic substrate 20 having sequentially deposited on each side thereof an underlayer 21, 21', such as chromium (Cr) or Cr-alloy, a magnetic layer 22, 22', typically comprising a cobalt (Co)-base alloy, and a protective overcoat 23, 23', typically containing carbon. Conventional practices also comprise bonding a lubricant topcoat (not shown) to the protective overcoat. Underlayer 21, 21', magnetic layer 22, 22', and protective overcoat 23, 23', are typically deposited by sputtering techniques. The Co-base alloy magnetic layer deposited by conventional techniques normally comprises polycrystallites epitaxially grown on the polycrystal Cr or Cr-alloy underlayer.

Figure 3:
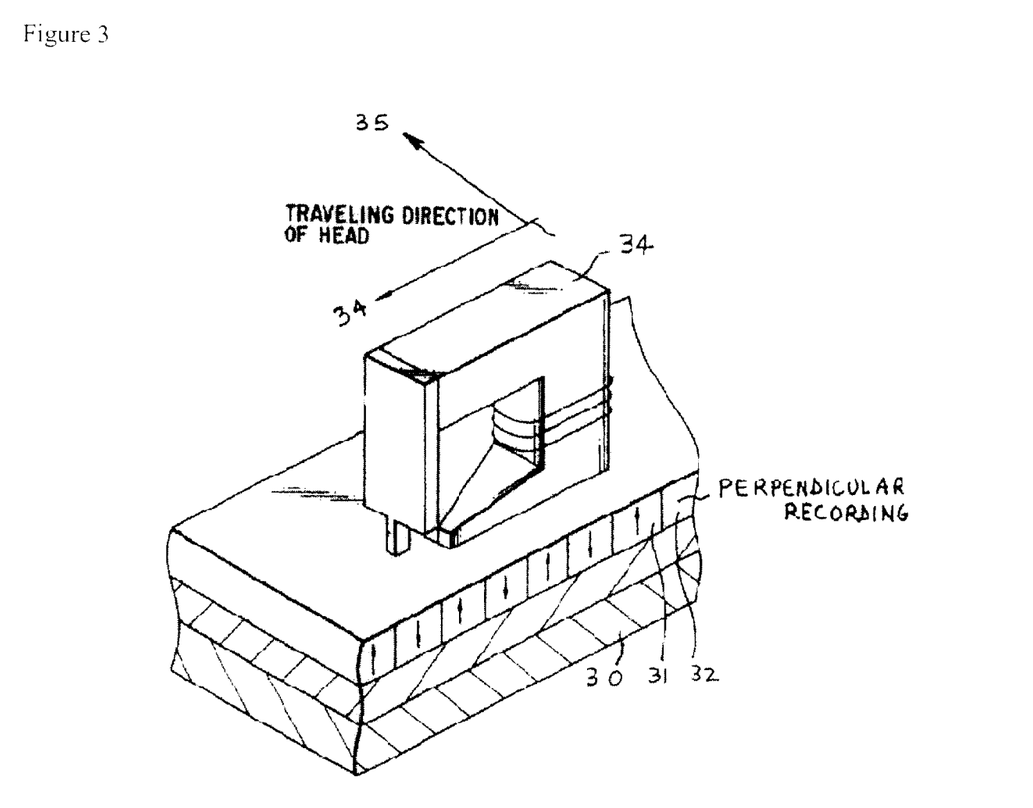
FIG. 3 is perspective view of a magnetic head and a magnetic disk of an embodiment of this invention.

A conventional perpendicular recording disk medium, shown in FIG. 3, is similar to the longitudinal recording medium depicted in FIG. 2, but with the following differences. First, a conventional perpendicular recording disk medium has soft magnetic underlayer 31 of an alloy such as Permalloy instead of a Cr-containing underlayer. Second, as shown in FIG. 3, magnetic layer 32 of the perpendicular recording disk medium comprises domains oriented in a direction perpendicular to the plane of the substrate 30. Also, shown in FIG. 3 are the following: (a) read-write head 33 located on the recording medium, (b) traveling direction 34 of head 33 and (c) transverse direction 35 with respect to the traveling direction 34.

The underlayer and magnetic layer are conventionally sequentially sputter deposited on the substrate in an inert gas atmosphere, such as an atmosphere of pure argon. A conventional carbon overcoat is typically deposited in argon with nitrogen, hydrogen or ethylene. Conventional lubricant topcoats are typically about 20 Å thick.

It is recognized that the magnetic properties, such as Hr, Mr, S* and SMNR, which are critical to the performance of a magnetic alloy film, depend primarily upon the microstructure of the magnetic layer which, in turn, is influenced by one or more underlying layers on which it is deposited. U.S. Pat. No. 5,363,794 discloses a method for fabricating recording media with perpendicular orientation from multi-layers of pairs of elements such as Co—Pt, Fe—Pt, Ni—Fe, etc. The method described creates an artificial superlattice, which upon annealing transforms to the desired magnetic properties with the desired perpendicular crystallographic orientation. The annealing step described in this prior art used a temperature between 650° and 700° C. for a time between 12 and 16 hours.

U.S. Pat. No. 5,603,766 describes a method for making recording media with perpendicular orientation from multi-player of pairs of elements selected from Co, Fe, Ni, together with a third element selected from Pt, Pd. The three elements were co-sputtered onto a single crystal substrate of MgO or $Al_2O_3$. The substrate was heated to a temperature above 450° C. before and during sputtering, which allows the formation of $L1_0$ phase directly, without the need for post-deposition annealing.

A report published by V. Parasote, et al., in *Journal of Magnetism and Magnetic Materials*, 1999, describes the formation of $L1_0$ ordered CoPt films by MBE (molecular beam epitaxial) deposition on heated substrates with Pt and Ag seed layers to induce a perpendicular orientation. The maximum coercivity observed was 3900 Oe, at a substrate temperature of 680 K during deposition.

U.S. Pat. No. 6,013,161 describes a thin film magnetic alloy with in-plane magnetic anisotropy composed of CoPtNi or CoPtCr, to which is added a "low-solubility" element selected from B, P, C, Si, As, Se and Te. The inclusion of these latter elements is for the stated purpose of improving grain uniformity and isolation, which leads to improved SNR.

Therefore, there exists a need for a perpendicular magnetic recording medium that has a single thin film, not multilayers, with a $L1_0$ structure and exhibits high coercivity. There also exists a need to form such a single layer thin film with a short annealing time of a few seconds, not hours.

SUMMARY OF THE INVENTION

In one embodiment, this invention does not require a thin film underlayer to induce the uniaxial perpendicular anisotropy. This invention does not require long anneal times, which may concurrently produce undesired grain growth. The alloy of this invention can be deposited by various methods, including sputter deposition, from elemental targets co-sputtered, or a single alloy target, or a combination of alloy and elemental sputter targets. In each case, in a preferred embodiment, this invention would require a single layer of the desired alloy film to be deposited, avoiding the need for underlayers or complex artificial superlattice structures.

The invention provides a perpendicular magnetic recording medium having high areal recording density exhibiting low noise, high coercivity. One embodiment is vapor deposition of $L1_0$-forming ferromagnetic alloy, such as CoPt or FePt, together with selected atomic fraction of boron (10% to 25%). The sputter target may be an alloy of the desired composition, or elemental targets may be co-sputtered.

In another embodiment, the magnetic layer comprising the CoPtB alloy could be sputtered onto an appropriate substrate, on which selected underlayer(s) may be deposited prior to deposition of the CoPtB alloy.

In yet another embodiment, the magnetic layer could be heated, either during deposition, or post-deposition, either in the sputter chamber, or after removal from the sputter chamber. The anneal time and temperature could be adjusted so that the sputtered film transforms from a magnetically soft phase to the desired magnetically hard phase (e.g., $L1_0$ phase). The preferred conditions are, post-deposition annealing at a temperature between 600 and 750° C. for times less than 10 seconds, or sputtering the alloy onto substrates that are simultaneously heated between 600 and 750° C.

An embodiment of this invention is a device comprising an annealed magnetic alloy comprising boron and a $L1_0$ structure. The annealed magnetic alloy could further comprise Co and Pt. In a preferred embodiment, the annealed magnetic alloy has a formula $\{Co_yPt_z\}_{100-x}B_x$, wherein x is in a range from greater than zero percent to about 20% and a ratio y/z is in a range from about 0.67 to 1.5. In yet another preferred embodiment, y is about 50%, z is about 50%, and x is selected from the group consisting of 10, 15 and 20%. The annealed magnetic alloy could be in a magnetic layer. The device of this invention could further comprise a layer of a soft magnetic material underneath the magnetic layer. The recording medium could have a coercivity of more than X, where X is selected from the group consisting of 5000 Oe, 6000 Oe, 7000 Oe, 8000 Oe, 9000 Oe and 10,000 Oe. In a preferred embodiment, the recording medium could be a disk. Furthermore, in a preferred embodiment, the magnetic layer could comprise an easy axis oriented substantially in a direction perpendicular to an in-plane direction of the magnetic layer. In a more preferred embodiment, the magnetic layer could be a single film.

Another embodiment is a method for manufacturing a magnetic recording disk for perpendicular recording, comprising depositing a magnetic alloy on a substrate to form a magnetic layer and annealing the magnetic alloy to form an annealed magnetic alloy; wherein the annealed magnetic alloy comprises boron and a $L1_0$ structure. The method could further comprise heating the substrate. The deposition of the magnetic alloy could be by sputtering. The annealing could be done at a temperature in a range of about 600 to 750° C. for a period in a range of about 5 to 900 seconds. In a preferred embodiment, there could be a further step of depositing a capping layer comprising SiN.

Another embodiment is a magnetic recording disk for perpendicular recording, comprising a substrate and means for recording data. In this invention, "means for recording data" include an annealed magnetic layer comprising boron and having an easy axis oriented substantially in a direction perpendicular to an in-plane direction of the magnetic layer.

As will be realized, this invention is capable of other and different embodiments, and its details are capable of modifications in various obvious respects, all without departing from this invention. Accordingly, the drawings and description are to be regarded as illustrative in nature and not as restrictive.

DETAILED DESCRIPTION

This invention provides magnetic recording media suitable for high areal recording density exhibiting high coercivity and high SMNR. This invention achieves such technological advantages by producing a magnetic alloy with uniaxial, perpendicular magnetic anisotropy appropriate for magneto-optical, optically assisted, or perpendicular recording methods. The alloy of the present invention is preferably fabricated as a single thin film with a natural $L1_0$ superlattice structure, without the need to fabricate an artificial superlattice from multilayers. The structure exhibits a true uniaxial orientation, unlike similar $L1_0$ structures in which three orthogonal easy axis orientations can coexist (e.g. parallel to <100>, <010> and <001> crystallographic directions.). The uniaxial easy axis is oriented perpendicular to the plane of the film, generally, without requiring underlayers to form the perpendicular orientation. The alloy is formed by post-deposition annealing at a temperature between 600 and 750° C. for times less than 10 seconds. This is considerably shorter anneal time than known to those informed in the prior art.

The alloy of this invention is formed from an $L1_0$ ordered phase CoPt alloy with perpendicular magnetic anisotropy and enhanced coercivity. In a preferred embodiment, this is accomplished by the addition of 10 to 25% Boron to the equiatomic CoPt alloy. A coercive force of over 9000 Oe, hysteretic squareness of 0.975, and saturation magnetization ($M_s$) of $4.8 \times 10^{-4}$ emu/cm$^3$ were obtained in a CoPt15% B alloy after 5 second anneal at 700° C. In addition, the addition of 10% or more Boron induces a strong (001) perpendicular crystallographic texture in the alloy.

In accordance with embodiments of this invention, the substrates that may be used in the invention include glass, glass-ceramic, NiP/aluminum, metal alloys, plastic/polymer material, ceramic, glass-polymer, composite materials or other non-magnetic materials.

Figure 4:
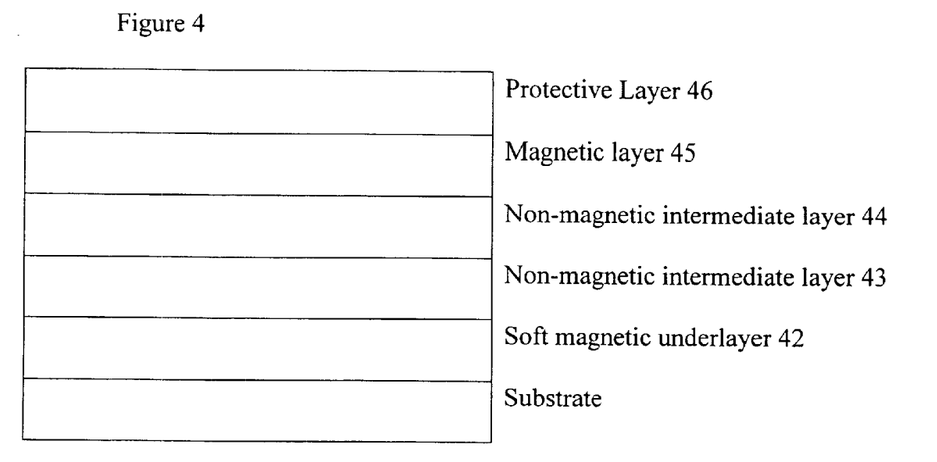
FIG. 4 is a schematic representation of the film structure in accordance with a magnetic recording medium of this invention.

A preferred embodiment of a perpendicular recording medium of this invention is shown in FIG. 4. The thickness of a soft magnetic underlayer 42 is about 200 nm, and the thickness of a magnetic layer 45 deposited on the underlayer is about 20 nm. In between the soft magnetic underlayer 42 and the magnetic layer 45 could be intermediate layers 43 and 44 of thickness of about 5–10 nm. A protective layer 46 typically covers the magnetic layer 45. A "soft magnetic" material is material that is easily magnetized and demagnetized. As compared to a soft magnetic material, a "hard magnetic" material is one that neither magnetizes nor demagnetizes easily.

EXAMPLES

All samples described in this disclosure were fabricated with DC magnetron sputtering except carbon films were made with RF magnetron sputtering.

Sputter deposited thin films of the general formula CoPtB (B=10 to 20 atom %) were induced to transform to a perpendicular oriented medium with high coercivity during post-deposition annealing. Coercivities of over 9000 Oe were attained after about 5 seconds of annealing at 700° C. in alloys with 15 and 20% B.

The films were fabricated from elemental targets of Co Pt and B co-sputtered in 5 mTorr Kr. The sputter power of each target was adjusted to form films of a fixed composition, such composition estimated from the sputter rate of the individual targets. The compositions were varied according to the formula of $\{Co_{50}Pt_{50}\}_{100-x}B_x$ where x=10, 15 and 20%. Some variation in the ratio of Co to Pt (from approximately 0.67 to 1.5) can be tolerated and still produce the high coercivity ordered $L1_0$ phase. The CoPtB alloy was sputtered on glass substrates on which an amorphous material, in particular, SiN was first sputtered. Following the deposition of the alloy film, a capping layer of SiN was sputter deposited.

Following deposition, the films were annealed in a rapid thermal process system in flowing Ar at 700° C. The anneal times were in the range of 5 to 900 seconds. Coercivity, remanence and squareness were measured at room temperature in a vibrating sample magnetometer.

Figure 5:
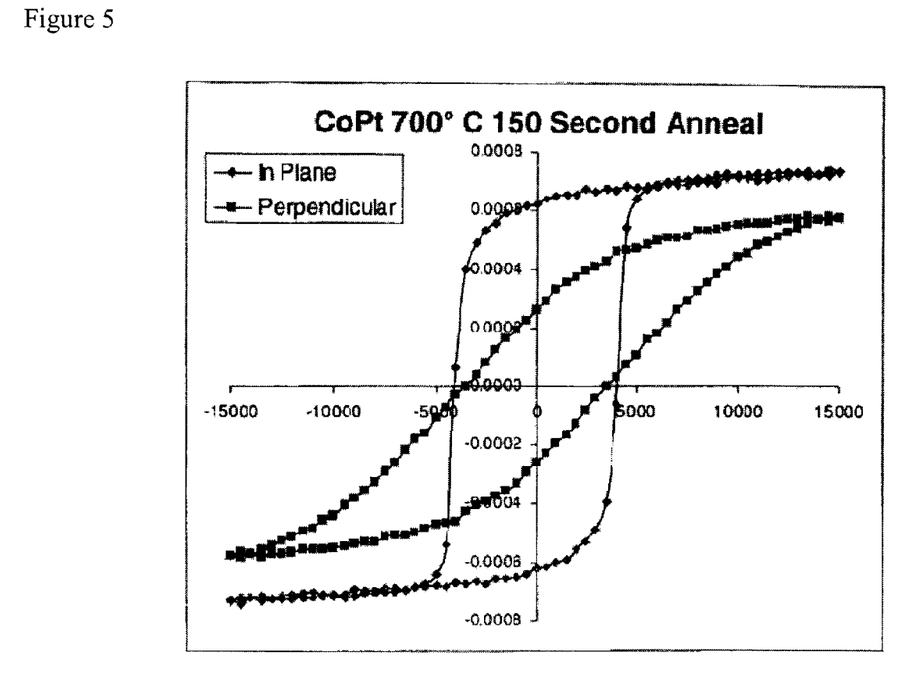
FIG. 5 represents the in-plane and perpendicular M-H hysteresis loops of a CoPt film of an embodiment of this invention.
Figure 6:
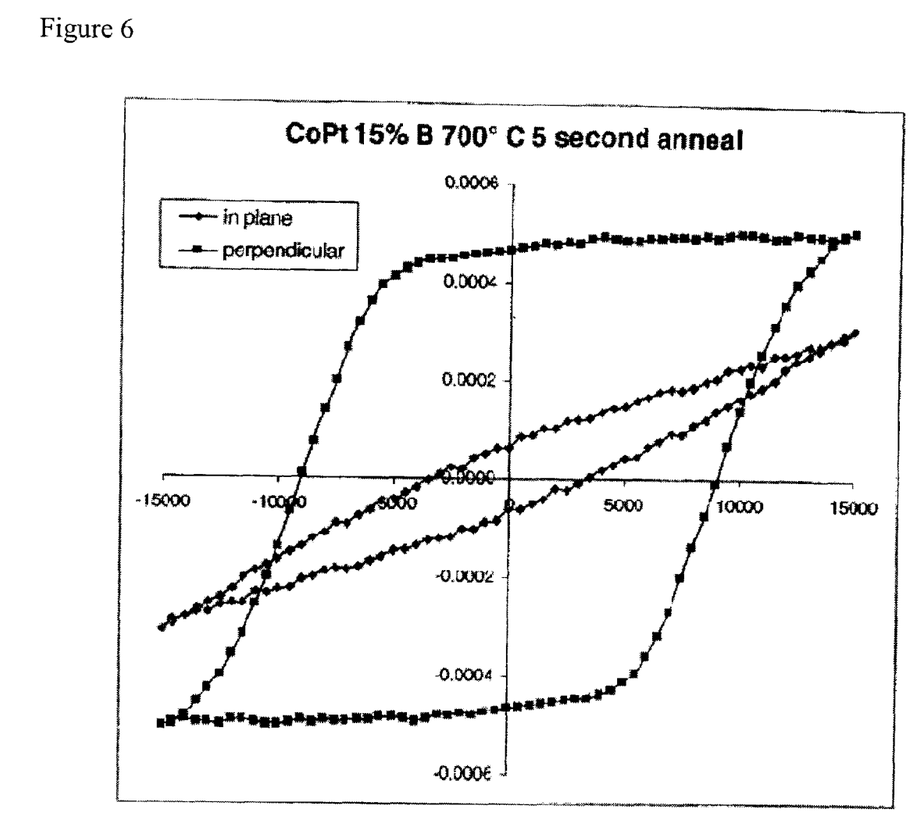
FIG. 6 represents the in-plane and perpendicular M-H hysteresis loops of a CoPtB film of an embodiment of this invention.

Films showed a marked increase in coercivity, a decrease in magnetization and similar squareness to the films without boron. In addition, a change in crystallographic orientation from 3-D random to perpendicular (001) texture occurred during annealing. FIG. 5 represents the in-plane and perpendicular M-H hysteresis loops of CoPt film annealed at 700° C. for 150 seconds, and FIG. 6 that of a CoPt 15%B film annealed at 700° C. for 5 seconds. The in-plane and perpendicular loops for CoPt have a similar coercivity, indicating that the anisotropy (easy) axes are oriented equally in all directions (3-D random orientation), while the CoPtB shows a very strong preference for perpendicular orientation, i.e., the easy axis of the CoPtB layer was oriented substantially in a direction perpendicular to the in-plane direction of the CoPtB layer. The CoPtB film has a much larger maximum coercivity than the CoPt film, and that this was obtained after about 5, seconds annealing, while the CoPt film attained a lower coercivity after 150 seconds.

Figure 7:
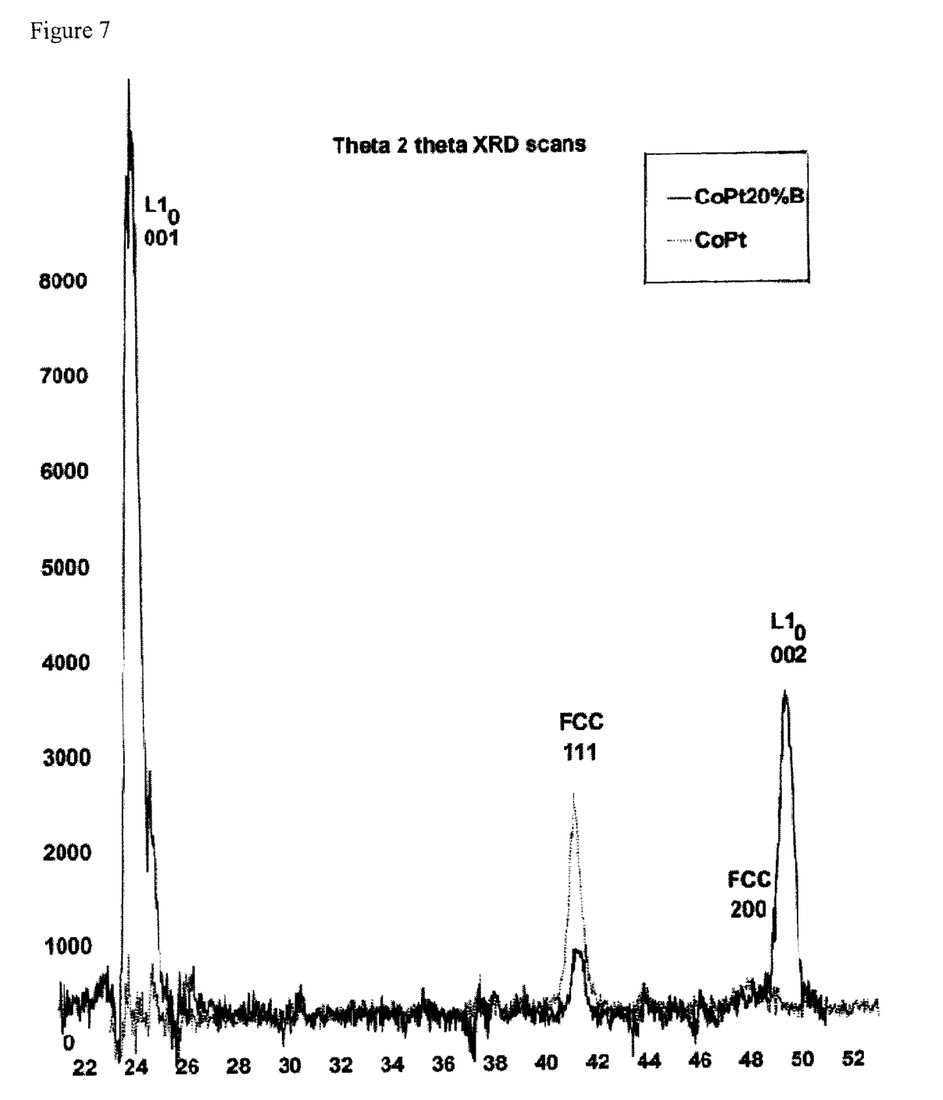
FIG. 7 shows X-ray diffraction scans of CoPt and CoPtB films.

Symmetric scan X-ray diffraction of the CoPt and CoPtB films that appear in FIG. 7 show the difference in crystallographic orientation induced by the boron.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein.

The entire disclosure of the patents and publications referred in this application are hereby incorporated herein by reference.

What is claimed is:

1. A magnetic recording device comprising a magnetic layer comprising an annealed magnetic alloy comprising a $L1_0$ structure, wherein the annealed magnetic alloy has a formula $\{Co_yPt_z\}_{100-x}B_x$, wherein x is in a range from greater than zero percent to about 20% and a ratio y/z is in a range from about 0.67 to 1.5, further wherein the magnetic layer comprises an easy axis oriented substantially in a direction perpendicular to an in-plane direction of the magnetic layer.

2. The device of claim 1, wherein y is about 50%, z is about 50%, and x is selected from the group consisting of 10, 15 and 20%.

3. The device of claim 1, further comprising a layer of a soft magnetic material underneath the magnetic layer.

4. The device of claim 1, wherein the recording medium has coercivity of more than X, where X is selected from the group consisting of 5000 Oe, 6000 Oe, 7000 Oe, 8000 Oe, 9000 Oe and 10,000 Oe.

5. The device of claim 1, wherein the recording medium is a disk.

6. The recording device of claim 1, wherein the magnetic layer is a single film.

7. A method for manufacturing a magnetic recording device for perpendicular recording, comprising:
   depositing a magnetic alloy on a substrate to formn a magnetic layer and
   annealing the magnetic alloy to form an annealed magnetic alloy;
   wherein the annealed magnetic alloy comprises a $L1_0$ structure,
   wherein the annealed magnetic alloy has a formula $\{Co_yPt_z\}_{100-x}B_x$, wherein x is in a range from greater than zero percent to about 20% and a ratio y/z is in a range from about 0.67 to 1.5, further wherein the magnetic layer comprises an easy axis oriented substantially in a direction perpendicular to an in-plane direction of the magnetic layer.

8. The method of claim 7, further comprising heating the substrate.

9. The method of claim 7, wherein the depositing a magnetic alloy is by sputtering.

10. The method of claim 7, wherein the annealing is done at a temperature in a range of about 600 to 750° C. for a period in a range of about 5 to 10 seconds.

11. The method of claim 7, further comprising depositing a capping layer comprising SiN.

12. The method of claim 7, wherein the magnetic layer is a single film.

13. A magnetic recording device for perpendicular recording, comprising a substrate and means for recording data comprising a $\{Co_yPt_z\}_{100-x}B_x$ layer having a $L1_0$ structure, wherein said $\{Co_yPt_z\}_{100-x}B_x$ layer comprises an easy axis oriented substantially in a direction perpendicular to an in-plane direction of said $\{Co_yPt_z\}_{100-x}B_x$ layer, wherein x is in a range from greater than zero percent to about 20% and a ratio y/z is in a range from about 0.67 to 1.5.

* * * * *